US012707661B2

(12) United States Patent
Gu et al.

(10) Patent No.: US 12,707,661 B2
(45) Date of Patent: Aug. 11, 2026

(54) DIODE AND MANUFACTURING METHOD THEREFOR, AND SEMICONDUCTOR DEVICE

(71) Applicant: CSMC TECHNOLOGIES FAB2 CO., LTD., Wuxi (CN)

(72) Inventors: Yan Gu, Wuxi (CN); Hua Song, Wuxi (CN); Nailong He, Wuxi (CN); Sen Zhang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 450 days.

(21) Appl. No.: 18/262,083

(22) PCT Filed: Mar. 3, 2022

(86) PCT No.: PCT/CN2022/079011

§ 371 (c)(1),
(2) Date: Jul. 19, 2023

(87) PCT Pub. No.: WO2022/227858

PCT Pub. Date: Nov. 3, 2022

(65) Prior Publication Data

US 2024/0072178 A1 Feb. 29, 2024

(30) Foreign Application Priority Data

Apr. 30, 2021 (CN) ........................ 202110484015.X

(51) Int. Cl.
*H10D 8/60* (2025.01)
*H10D 8/01* (2025.01)
(Continued)

(52) U.S. Cl.
CPC ............... *H10D 8/60* (2025.01); *H10D 8/051* (2025.01); *H10D 12/421* (2025.01);
(Continued)

(58) Field of Classification Search
CPC ............ H10D 8/00; H10D 8/01; H10D 8/024; H10D 8/041; H10D 8/20; H10D 8/30;
(Continued)

(56) References Cited

U.S. PATENT DOCUMENTS

2005/0056906 A1 3/2005 Jimbo et al.
2007/0158680 A1 7/2007 Ozeki et al.
(Continued)

FOREIGN PATENT DOCUMENTS

CN 102376773 A 3/2012
CN 102403341 A 4/2012
(Continued)

OTHER PUBLICATIONS

PCT International Search Report and Written Opinion (w/ English translations) for corresponding PCT Application No. PCT/CN2022/079011, mailed May 6, 2022, 11 pages.
(Continued)

*Primary Examiner* — Natalia A Gondarenko
(74) *Attorney, Agent, or Firm* — Dority & Manning, PA

(57) ABSTRACT

A diode and a manufacturing method therefor, and a semiconductor device. The diode includes: a substrate; an insulating buried layer provided on the substrate; a semiconductor layer provided on the insulating buried layer; anode; and a cathode, comprising: a trench-type contact, a trench being filled with a contact material, the trench extending from a first surface of the semiconductor layer to a second surface of the semiconductor layer, the first surface being a surface distant from the insulating buried layer, and the second surface being a surface facing the insulating buried layer; a cathode doped region surrounding the trench-type contact around and at the bottom of the trench-type contact, and also disposed on the first surface around the trench-type contact; and a negative electrode located on the cathode doped region and electrically connected to the cathode doped region.

19 Claims, 5 Drawing Sheets

(51) Int. Cl.

| | |
|---|---|
| ***H10D 12/00*** | (2025.01) |
| ***H10D 30/01*** | (2025.01) |
| ***H10D 30/60*** | (2025.01) |
| ***H10D 64/00*** | (2025.01) |

(52) U.S. Cl.
CPC ....... *H10D 30/0221* (2025.01); *H10D 30/603* (2025.01); *H10D 64/112* (2025.01)

(58) Field of Classification Search
CPC .......... H10D 8/422; H10D 8/60; H10D 8/605; H10D 8/051; H10D 8/043; H10D 8/411; H10D 12/211; H10D 12/212; H10D 12/416; H10D 12/421; H10D 64/111; H10D 64/112; H10D 64/117; H10D 10/061; H10D 10/211; H10D 10/221; H10D 10/60; H10D 84/15; H10D 84/153; H10D 84/156; H10D 84/158; H10D 62/115; H10D 62/10; H10D 62/124; H10D 62/128; H10D 62/129; H10D 30/0221; H10D 30/603; H10D 30/65; H10D 30/655; H10D 30/657
USPC ......................................... 257/471, 288, 330
See application file for complete search history.

(56) References Cited

U.S. PATENT DOCUMENTS

| | | | | |
|---|---|---|---|---|
| 2012/0032313 | A1 | 2/2012 | Yamamoto et al. | |
| 2014/0110814 | A1 | 4/2014 | Lin et al. | |
| 2014/0225234 | A1 | 8/2014 | Yamamoto et al. | |
| 2015/0162454 | A1 | 6/2015 | Chen | |
| 2016/0307885 | A1* | 10/2016 | Weyers | H10D 62/128 |
| 2017/0025411 | A1 | 1/2017 | Kumar et al. | |
| 2020/0403104 | A1* | 12/2020 | Hamazawa | H10D 64/117 |
| 2021/0193847 | A1* | 6/2021 | Pjencak | H10D 8/422 |

FOREIGN PATENT DOCUMENTS

| | | | |
|---|---|---|---|
| CN | 104701355 | A | 6/2015 |
| CN | 105990423 | A | 10/2016 |
| CN | 110190113 | A | 8/2019 |
| CN | 111933687 | A | 11/2020 |
| CN | 112133760 | A | 12/2020 |
| JP | 2002334990 | A | 11/2002 |
| JP | 2013197134 | A | 9/2013 |

OTHER PUBLICATIONS

Extended European Search Report for corresponding Application No. 22794337.0, dated Oct. 22, 2024, 11 pages.

Chinese Office Action (w/ English translation) for corresponding Application No. 202110484015.X, dated Oct. 19, 2024, 19 pages.

A. Nakagawa et al., "Breakdown Voltage Enhancement for Devices on Thin Silicon Layer/Silicon Dioxide Film", IEEE Transactions on Electron Devices, 8093, No. 7, New York, US, Jul. 1991, p. 1650-1654.

H. Funaki et al., "Lateral SOI Diode Design Optimization for High Ruggedness and Low Temperature Dependence of Reverse Recovery Characteristics", Proceedings of 1998 International Symposium on Power Semiconductor Devices and ICs, IEEE, Japan, 1998, 4 pages.

Korean Office Action (w/ English translation) for corresponding Application No. 10-2023-7025755, dated Jul. 11, 2024, 19 pages.

* cited by examiner

DIODE AND MANUFACTURING METHOD THEREFOR, AND SEMICONDUCTOR DEVICE

CROSS-REFERENCE TO RELATED APPLICATIONS

This application is an U.S. national phase application under 35 U.S.C. § 371 based upon international patent application No. PCT/CN2022/079011, filed on Mar. 3, 2022, which itself claims priority to Chinese patent application No. 202110484015X filed on Apr. 30, 2021. The contents of the above identified applications are hereby incorporated herein in their entireties by reference.

TECHNICAL FIELD

The present disclosure relates to a field of semiconductor manufacturing, in particular to a diode, and further to a method for manufacturing a diode, and a semiconductor device.

BACKGROUND

In the high-voltage SOI process, LIGBT (lateral insulated gate bipolar transistor) has become a dominant design in the market as a mainstream switching tube. For the switching process of LIGBT to drive inductive loads, a current in the inductance coil cannot change abruptly when the LIGBT is turned off, and at the same time, there is a trailing current when the LIGBT is turned off. The superposition of the two currents can easily lead to thermal breakdown of the LIGBT. Therefore, when the LIGBT is used as a switching device, a diode should be connected in parallel between a collector and an emitter of LIGBT to increase a current channel, so that redundant current can return to the coil to protect the LIGBT switching tube.

The forward conduction and reverse recovery characteristics of a freewheeling diode have a great impact on an entire switch module. The lower the forward conduction voltage, the lower the power consumption and heat generation. The reverse recovery of the freewheeling diode corresponds to turning on the LIGBT. If the reverse recovery time is long, the diode has not recovered and the LIGBT has been turned on. The superposition of the two currents will also easily damage the switching tube. Therefore, reducing the reverse recovery time of the freewheeling diode and reducing the recovery peak current in a corresponding direction has always been a difficulty in the industry.

SUMMARY

Accordingly, it is necessary to provide a diode with a short reverse recovery time, a method for manufacturing the diode, and a semiconductor device.

A diode based on a silicon on insulator structure includes a substrate, an insulating buried layer provided on the substrate, a semiconductor layer provided on the insulating buried layer, an anode, and a cathode. The cathode includes a trench type contact, a trench being filled with a contact material, the trench extending from a first surface of the semiconductor layer to a second surface of the semiconductor layer, the first surface being a surface away from the insulating buried layer, and the second surface being a surface facing the insulating buried layer, a cathode doped region having a first conductivity type, the cathode doped region being provided at a periphery and a bottom of the trench type contact and surrounding the trench type contact, and the cathode doped region being provided on the first surface around the trench type contact; and a cathode electrode provided on the cathode doped region and electrically connected to the cathode doped region.

A semiconductor device based on a silicon on insulator structure includes a lateral insulated gate bipolar transistor and the aforementioned diode integrated with the lateral insulated gate bipolar transistor, the diode is connected in parallel between a collector and an emitter of the lateral insulated gate bipolar transistor.

A method for manufacturing a diode, the diode being based on a silicon on insulator structure, the method includes providing a base, the base comprising a substrate, an insulating buried layer, and a semiconductor layer that are sequentially stacked; forming a first trench extending from a first surface of the semiconductor layer to a second surface of the semiconductor layer, wherein the first surface is a surface away from the insulating buried layer, and the second surface is a surface facing the insulating buried layer; forming a cathode doped region on the semiconductor layer at a periphery and a bottom of the first trench, the cathode doped region having a first conductivity type; filling a contact material in the first trench; and forming a cathode electrode on the cathode doped region and electrically connected to the cathode doped region.

Details of one or more embodiments of the present disclosure are set forth in the following drawings and descriptions. Other features, objects and advantages of the present disclosure become apparent from the description, drawings and claims.

BRIEF DESCRIPTION OF THE DRAWINGS

In order to better describe and illustrate embodiments and/or examples of those present disclosures disclosed herein, reference may be made to one or more figures. Additional details or examples used to describe the drawings should not be considered as limiting the scope of any of the disclosed present disclosures, the currently described embodiments and/or examples, and the best mode of these present disclosures currently understood.

DETAILED DESCRIPTION OF THE EMBODIMENTS

Figure 1:
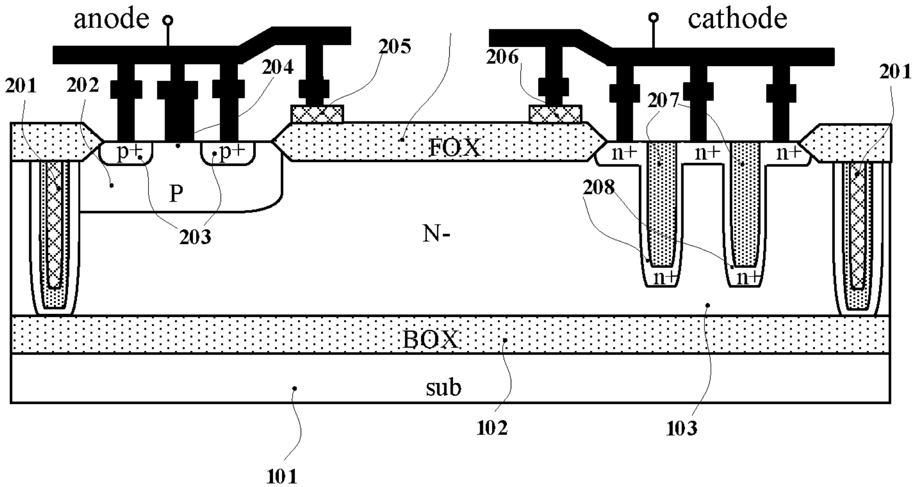
FIG. 1 is a schematic cross-sectional view of a diode according to an embodiment.

In order to facilitate the understanding of the present disclosure, the present disclosure will be described more fully below with reference to relevant attached drawings. Preferred embodiments of the present disclosure are illustrated in the drawings. However, the present disclosure can be implemented in many different forms and is not limited to the embodiments described herein. On the contrary, providing these embodiments is to assist understanding the content disclosed by the present disclosure more fully and thoroughly.

Unless otherwise defined, all technical and scientific terms used herein have the same meaning as commonly understood by those skilled in the technical field of the present disclosure. The terms used in the specification of the present disclosure herein are only for the purpose of describing specific embodiments, and are not intended to limit the present disclosure. The term "and/or" as used herein includes any and all combinations of one or more related listed items.

It will be understood that when an element or layer is referred to as being "on", "adjacent", "connected to" or "coupled to" another element or laver, it can be directly on, adjacent to, connected to, or coupled to the other element or layer, or intervening elements or layers may be present. In contrast, when an element is referred to as being "directly on", "directly adjacent to", "directly connected to", or "directly coupled to" another element or layer, no intervening elements or layers are present. It will be understood that, although the terms first, second, third etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The spatial relationship terms such as "under", "below", "on", "above", etc., may be used herein for convenience of description to describe the relationship of one element or feature to other elements or features shown in the figures. It will be understood that the spatial relationship terms are intended to encompass different orientations of the device in use and operation in addition to the orientation shown in the figures. For example, if a device in the figures is turned over, elements or features described as "below" or "under" other elements or features would then be oriented "above" the other elements or features. Thus, the exemplary terms "below" and "under" may encompass both upper and lower orientations. The device may be in alternative orientations (rotated 90 degrees or at other orientations) and the spatial descriptors used herein interpreted accordingly.

The terms used herein is for the purpose of describing particular embodiments only and is not intended to be limiting of the present disclosure. As used herein, the singular forms "a", "an" and "the" are intended to include the plural forms as well, unless the context clearly dictates otherwise. It should also be understood that the terms "consists of" and/or "including", when used in this specification, specify the presence of stated features, integers, steps, operations, elements and/or components, but do not preclude the presence or addition of one or more other features, integers, steps, operations, elements, components, and/or groups thereof. As used herein, the term "and/or" includes any and all combinations of the associated listed items.

Embodiments of the present disclosure are described herein with reference to cross-section views of desirable embodiments (and intermediate structures) of the present disclosure. As such, variations from the shapes shown due to, for example, manufacturing techniques and/or tolerances may be expected. Accordingly, embodiments of the present disclosure should not be limited to the particular shapes of regions illustrated herein, but rather include deviations in shape due to, for example, manufacturing. For example, an implanted region illustrated as a rectangle will, typically, have rounded or curved features and/or a gradient of implant concentration at its edges rather than a binary change from implanted to non-implanted region. Similarly, a buried region formed by implantation may result in some implantation in the region between the buried region and the surface through which the implantation was performed. Thus, the regions shown in the figures are schematic in nature, and their shapes are not intended to illustrate the actual shape of the region of a device and are not intended to limit the scope of the present disclosure.

Terms related to a semiconductor field used herein are technical terms commonly used by those skilled in the art. For example, for P type and N type impurities, in order to distinguish a doping concentration, a P+ type simply represents a P type with heavy doping concentration, a P type represents a P type with medium doping concentration, a P-type represents a P type with light doping concentration, a N+ type represents a N type with heavy doping concentration, a N type represents a N type with medium doping concentration, and a N− type represents a N type with light doping concentration.

In conventional high-voltage diodes, when the diode is conducted forward, a large number of minority carrier holes will be injected, which will generate current and carry out freewheeling. When the freewheeling phase is over, these holes remain in the device (diode). In addition, in order to achieve high withstand voltage, the high-voltage diode has a long drift region, and there are many intrinsic minority carriers stored in the drift region of the diode. Therefore, when the high-voltage diode is turned from forward conduction to reverse cut-off, the minority carriers cannot be recombined quickly. The reverse recovery time becomes very long, and the corresponding peak current during reverse recovery is also very large, so that it is difficult to meet the high speed and low loss switching requirements in a switching device.

FIG. 1 is a schematic cross-sectional view of a diode according to an embodiment. In this embodiment, the diode is integrated with a lateral insulated gate bipolar transistor of SOI (silicon on insulator) structure for manufacturing and using, so that the diode is also based on the SOI structure. As shown in FIG. 1, the diode includes a substrate 101, an insulating buried layer 102, a semiconductor layer 103, an anode, and a cathode. The cathode includes a trench type contact 207, a cathode doped region 208, and a cathode electrode.

The trench type contact 207 is a structure in which a contact material is filled in a trench. In an embodiment of the present disclosure, the contact material may be silicon oxide (e.g., silicon dioxide), polysilicon, amorphous silicon (a-Si), or some dielectric material with good fluidity.

The cathode doped region 208 has a first conductivity type. The cathode doped region 208 is provided at a periphery and a bottom of the trench type contact 207 and surrounds the trench type contact 207. The cathode doped region 208 is also provided around the trench type contact 207 on a surface of the semiconductor layer 103. In the embodiment shown in FIG. 1, the first conductivity type is N type, and a second conductivity type is P type.

The cathode electrode is provided on the cathode doped region 208 and is electrically connected to the cathode doped region 208.

Figure 5:
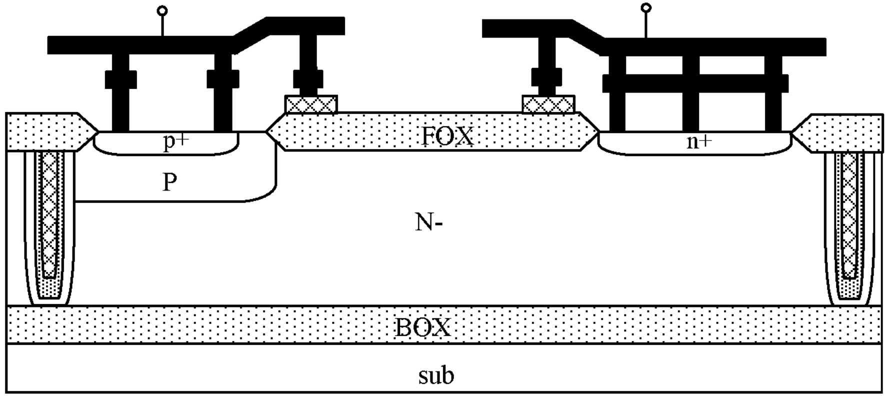
FIG. 5 is a schematic cross-sectional view of a diode of a comparative example.

In the above diode, the cathode is provided with the trench type contact 207, and the cathode doped region 208 is formed at the periphery and the bottom of the trench, so that the cathode doped region 208 includes a lateral region on a surface of the semiconductor layer 103, a longitudinal region along a trench wall, and a trench bottom region. An area of the cathode doped region 208 is greatly increased compared with a cathode doped region of a comparative example shown in FIG. 5, so that when the parallel lateral insulated gate bipolar transistor is turned off, an area of the diode configured to collect and recombine minority carriers is increased, and a speed and efficiency of the diode reverse recovery are high.

In an embodiment of the present disclosure, the semiconductor layer 103 includes a drift region of the first conductivity type. In the embodiment shown in FIG. 1, the drift region is an N− region, the cathode doped region 208 is an N+ region.

In the embodiment shown in FIG. 1, the diode further includes a field oxide (FOX) structure 209 and a cathode polysilicon field plate 206. The field oxide structure 209 is provided on the semiconductor layer 103 and is located between the anode and the cathode of the diode. The cathode polysilicon field plate 206 is provided on the field oxide structure 209 and electrically connected to the cathode electrode. Specifically, the cathode electrode can be electrically connected to the cathode polysilicon field plate 206 through a contact. Since the cathode polysilicon field plate 206 is provided on the field oxide structure 209, electric field lines in the cathode region can be adjusted during reverse depletion of the diode.

In one embodiment of the present application, the diode includes at least one trench type contact 207. Since a width of the trench is small (the width of each trench type contact 207 is 0.3% to 0.5% of a width of the cathode), adding the trench type contact 207 has little effect on the overall area of the device. Compared with a method of increasing the recombination rate by increasing the area of the cathode doped region 208 on the surface of the semiconductor layer 103, the area of the device is smaller. Moreover, increasing the area of the cathode doped region 208 on the surface of the semiconductor layer 103 will result in an increase in an area of the drift region, and the inherent minority carriers in the diode will also increase with the increase in the area of the drift region, which is not conducive to the efficiency of reverse recombination.

In an embodiment of the present disclosure, the cathode electrode forms an ohmic contact with the cathode doped region 208 through a contact, and the cathode electrode is not in direct contact with the trench type contact 207. Specifically, the cathode electrode may be connected to a lateral region of the cathode doped region 208 located on the surface of the semiconductor layer 103 through the contact.

In the embodiment shown in FIG. 1, the anode includes a well region 202, an anode doped region 203, and an anode electrode. The well region 202 has the second conductivity type and is provided in the semiconductor layer 103. The anode doped region 203 is of the second conductivity type and is provided in the well region 202. A doping concentration of the anode doped region 203 is greater than that of the well region 202. In the embodiment shown in FIG. 1, the well region 202 is a high voltage P well, and the anode doped region 203 is a P+ region. A part of the anode electrode is in direct contact with the anode doped region 203 through a contact, and another part of the anode electrode is in direct contact with the well region 202 through a contact. It should be understood that the contact in contact with the anode doped region 203 and the contact in contact with the well region 202 are different contacts.

In the embodiment shown in FIG. 1, the well region 202 includes at least two anode doped regions 203, and the anode doped regions 203 in the well region 202 are spaced apart from each other by the well region 202. Each anode doped region 203 forms an ohmic contact with a conductive material in the corresponding contact, and the well region 202 forms a Schottky contact 204 with the conductive material in the corresponding contact. A part of the well region 202 located between the anode doped regions 203 forms a Schottky contact by directly contacting the corresponding contact, which can reduce the efficiency of minority carrier injection when the diode is conducted forward, and a conductance modulation effect can be formed. In combination with the cathode trench N+ ohmic contact structure of the present disclosure, the number of minority carriers can be further reduced, and the reverse recovery time can be shortened.

In the embodiment shown in FIG. 1, the diode further includes an anode polysilicon field plate 205 provided on the field oxide structure 209. The anode polysilicon field plate 205 is electrically connected to the anode. Since the anode polysilicon field plate 205 is provided on the field oxide structure 209, electric field lines in the anode region can be adjusted during reverse depletion of the diode.

In the embodiment shown in FIG. 1, an isolation trench structure 201 is further provided on an outside of the well region 202 (i.e., a side away from the cathode), and an isolation trench structure 201 is also provided on an outside of the cathode doped region 208 (i.e., a side away from the anode). The isolation trench structure 201 extends downwards to the insulating buried layer 102, so as to be an isolation structure for the diode on the SOI material. In the embodiment shown in FIG. 1, the field oxide structures (not labeled in FIG. 1) are further provided on both isolation trench structures 201. In an embodiment of the present disclosure, the isolation trench structure 201 is filled with a dielectric layer, which may be, for example, a silicon oxide material, or may be formed by forming silicon dioxide on the sidewall of the trench, and then the remaining positions are filled with polysilicon and planarized.

In an embodiment of the present disclosure, the diode is a fast recovery SOI high voltage freewheeling diode.

In an embodiment of the present disclosure, both the substrate 101 and the semiconductor layer 103 are silicon layers. The insulating buried layer 102 is a buried oxide layer, and the material of the insulating buried layer 102 may be silicon dioxide.

Figure 2:
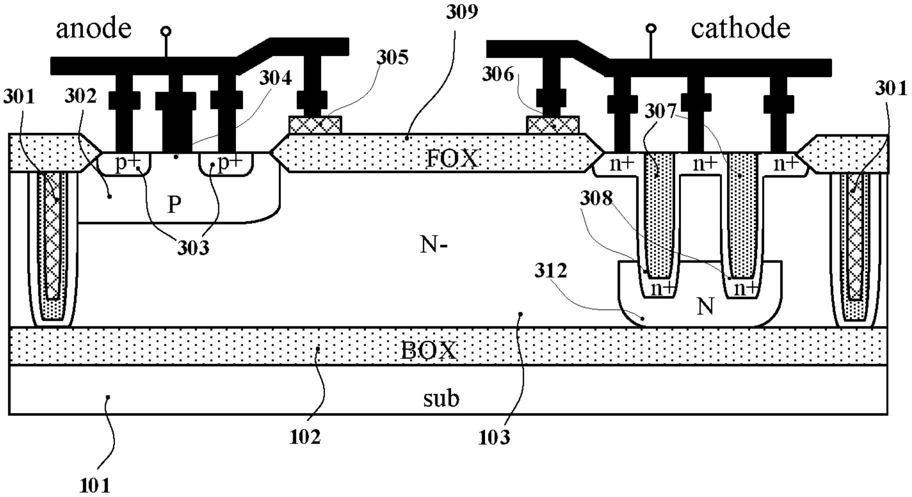
FIG. 2 is a schematic cross-sectional view of the diode according to another embodiment.

FIG. 2 is a schematic cross-sectional view of the diode according to another embodiment. In this embodiment, the diode includes the substrate 101, the insulating buried layer 102, and the semiconductor layer 103 that are stacked sequentially. A well region 302, a trench type contact 307, and a cathode doped region 308 are provided in the semiconductor layer 103. A plurality of anode doped regions 303 are provided in the well region 302. The cathode electrode forms an ohmic contact with the cathode doped region 308 through the contact, the anode electrode forms an ohmic contact with each anode doped region 303 through the corresponding contact, and forms a Schottky contact 304 with the well region 302 through the corresponding contact. In the semiconductor layer 103, two isolation trench structures 301 are provided on both sides of the diode, the field oxide structure is provided on the isolation trench structure 301, and a field oxide structure 309 is also provided on the surface of the semiconductor layer 103 between the well region 302 and the cathode doped region 308. An anode polysilicon field plate 305 and a cathode polysilicon field plate 306 are provided on an anode side and a cathode side of the field oxide structure 309, respectively. The anode polysilicon field plate 305 is electrically connected to the anode electrode through the contact, and the cathode polysilicon field plate 306 is electrically connected to the cathode electrode through the contact.

The main difference between the embodiments shown in FIG. 2 and FIG. 1 lies in that the diode further includes a first conductivity type well region 312. The first conductivity type well region 312 is provided at a bottom of the trench type contact 307 and extends downwards to the insulating buried layer 102. In the embodiment shown in FIG. 2, the first conductivity type well region 312 is an N well, and the doping concentration of the first conductivity type well region 312 is greater than the doping concentration of the N-drift region of the semiconductor layer 103 and less than the doping concentration of the cathode doped region 308. The first conductivity type well region 312 with a doping concentration higher than that of the drift region is provided at the bottom of the trench, so that the resistivity of the region adjacent to the bottom of the trench can be reduced, and more minority carriers can be absorbed to participate in the recombination during the reverse recovery of the diode, thereby further improving the recombination efficiency of the minority carriers during the reverse recovery of the diode.

The present disclosure correspondingly provides a semiconductor device based on an SOI structure, which includes the lateral insulated gate bipolar transistor (LIGBT) and the diode as described in any of the aforementioned embodiments. The LIGBT and the diode are both integrated on the SOI structure, and the diode is connected in parallel between a collector and an emitter of LIGBT.

Figure 3:
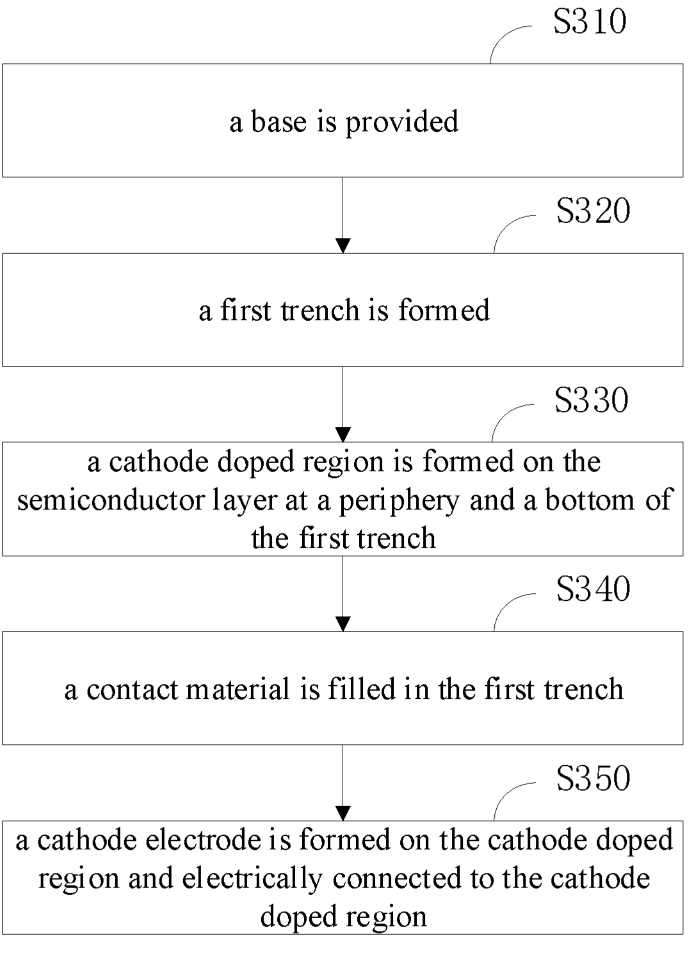
FIG. 3 is a flowchart of a method for manufacturing a diode according to an embodiment.

FIG. 3 is a flowchart of a method for manufacturing a diode according to an embodiment, which includes the following steps.

In S310, a base is provided.

Figure 4A:
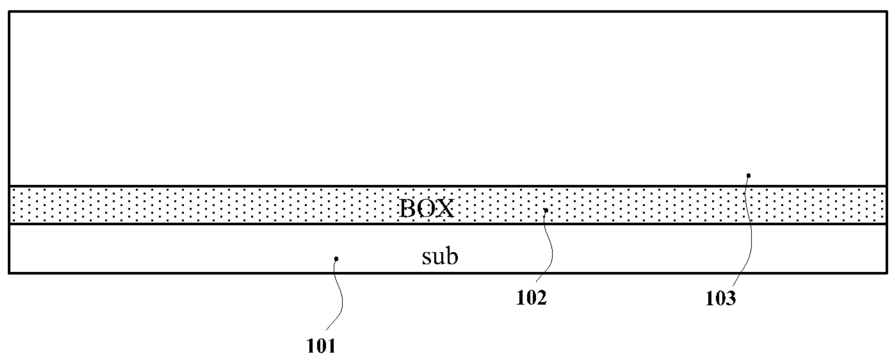
FIGS. 4*a* to 4*e* are schematic cross-sectional views of a device in a process of manufacturing the diode using the method shown in FIG. 3.

Referring to FIG. 4*a*, the base includes a substrate 101, an insulating buried layer 102, and a semiconductor layer 103 that are sequentially stacked. In an embodiment of the present disclosure, both the substrate 101 and the semiconductor layer 103 are silicon layers. The insulating buried layer 102 is a buried oxide layer, and the material of the insulating buried layer 102 may be silicon dioxide. In an embodiment of the present disclosure, the semiconductor layer 103 includes a drift region of the first conductivity type. In the embodiment shown in FIG. 4*a*, the first conductivity type is N type, the second conductivity type is P type, and the drift region is N-drift region.

S320, a first trench is formed.

In an embodiment of the present disclosure, at least one first trench 104 is formed by etching downward from the surface of the semiconductor layer 103 through photolithography and etching processes.

Figure 4B:
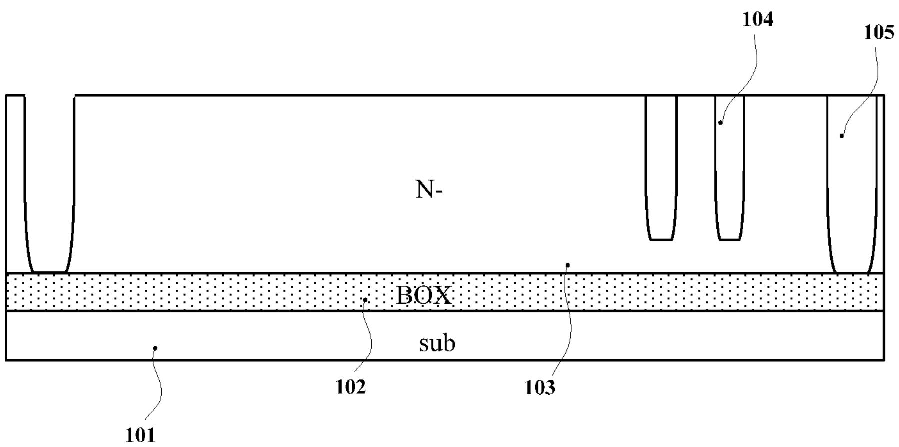

In the embodiment shown in FIG. 4*b*, while the first trench 104 is etched, the isolation trench 105 configured to isolate the diodes is etched simultaneously. A width of the first trench 104 is provided smaller through photolithography, so that an etching rate of the first trench 104 is slower. A width of the isolation trench 105 is greater than the width of the first groove 104, and the etching rate is faster, so that when a bottom of the isolation trench 105 is etched to the insulating buried layer 102, a bottom of the first trench 104 is still a distance away from the insulating buried layer 102. In an embodiment of the present disclosure, the width of each first trench 104 is 0.3% to 0.5% of the width of the cathode region of the diode. By controlling the width of the first trench 104 and a depth-to-width ratio of etching in the process, the first trench 104 and the isolation trench 105 can be formed at the same time (in the same process), so that the manufacturing cost can be saved and the manufacturing efficiency can be improved.

S330, a cathode doped region is formed on the semiconductor layer at a periphery and a bottom of the first trench.

Figure 4C:
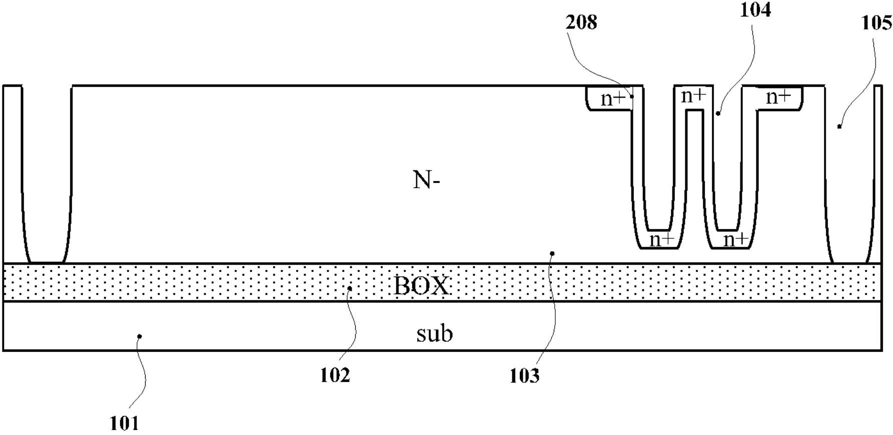
Figure 4D:
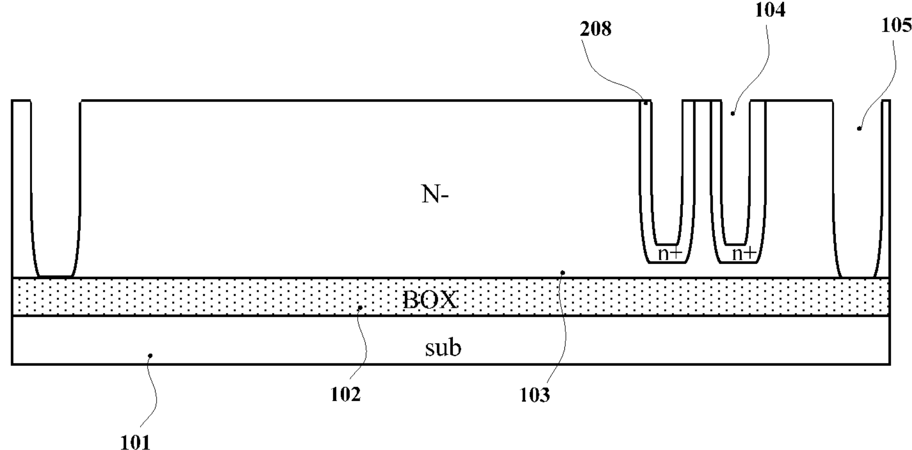

In an embodiment of the present disclosure, the cathode doped region 208 is formed by implanting ions of the first conductivity type through an ion implantation process, as shown in FIG. 4*c*. In the embodiment shown in FIG. 4*c*, the cathode doped region 208 is an N+ region. In other embodiments, as shown in FIG. 4*d*, the implantation of N type ions in step S330 may also form the cathode doped region 208 on the sidewall and bottom of the first trench 104 first, and then form the cathode doped region 208 on the surface of the semiconductor layer 103 through another ion implantation process.

S340, a contact material is filled in the first trench.

Figure 4E:
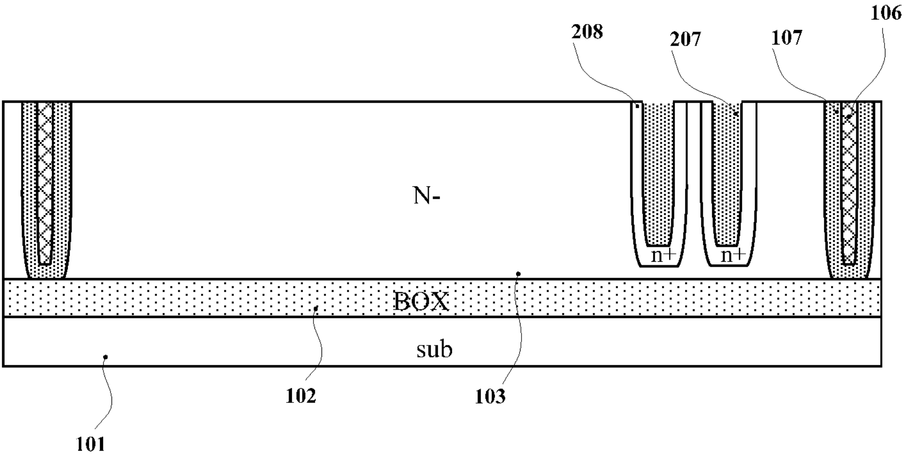

In an embodiment of the present disclosure, step S340 includes a step of oxidizing the sidewall of the trench. As for the first trench 104, since the width of the first trench 104 is relatively small, the first trench 104 can be filled only through the step of oxidizing the sidewall of the trench, while the width of the isolation trench 105 is larger, therefore after the sidewall of the trench is oxidized, the remaining position of the isolation trench 105 can be filled with a dielectric or polysilicon and then planarized, as shown in FIG. 4*e*.

S350, a cathode electrode is formed on the cathode doped region and electrically connected to the cathode doped region.

The remaining structure of the cathode and the anode of the diode may be formed after step S340, which includes forming the field oxide structure, forming the well region in the semiconductor layer 103, forming the anode doped region in the well region, forming the anode polysilicon field plate and the cathode polysilicon field plate on the field oxide structure, and forming the anode electrode and the cathode electrode. The anode electrode is electrically connected to the anode polysilicon field plate, the well region and the anode doped region through the contact, forms the ohmic contact with the anode doped region and forms the Schottky contact with the well region. The cathode electrode is electrically connected to the cathode polysilicon field plate and the cathode doped region through the contact, and forms the ohmic contact with the cathode doped region.

It should be understood that although the various steps in the flow charts of the present application are shown sequentially as indicated by the arrows, the steps need not necessarily be performed sequentially in the order indicated by the arrows. Unless otherwise specified herein, there is no strict order of execution of the steps, and the steps may be executed in other orders. Moreover, at least some of the steps in the flow chart of the present disclosure may include multiple steps or multiple stages. These steps or stages are not necessarily performed at the same time, but may be performed at different times. The execution order of these steps or stages is not necessarily sequential, but may be performed in turn or alternately with other steps or at least a part of the steps or stages in other steps.

In the description of this specification, the descriptions referring to the terms “some embodiments”, “other embodiments”, “ideal embodiments” and the like mean that specific features, structures, materials, or characteristics described in connection with the embodiments or examples are included in at least one embodiment or example of the present disclosure. In this specification, schematic descriptions of the above terms do not necessarily refer to the same embodiment or example.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention.

What is claimed is:

1. A diode based on a silicon on insulator structure, comprising:
- a substrate;
- an insulating buried layer provided on the substrate;
- a semiconductor layer provided on the insulating buried layer;
- an anode; and
- a cathode comprising:
  - at least one trench type contact, a trench being filled with a contact material, the trench extending from a first surface of the semiconductor layer to a second surface of the semiconductor layer, the first surface being a surface away from the insulating buried layer, and the second surface being a surface facing the insulating buried layer;
  - a cathode doped region having a first conductivity type, the cathode doped region being provided at a periphery and a bottom of the at least one trench type contact and surrounding the at least one trench type contact, and the cathode doped region being provided on the first surface around the at least one trench type contact;
  - a cathode electrode provided on the cathode doped region and electrically connected to the cathode doped region; and
  - a first conductivity type well region provided between a bottom of the at least one trench type contact and the insulating buried layer, the semiconductor layer comprising a drift region of the first conductivity type, a doping concentration of the first conductivity type well region being greater than a doping concentration of the drift region.

2. The diode according to claim 1, wherein the contact material comprises at least one selected from the group consisting of silicon oxide, polysilicon, and amorphous silicon.

3. The diode according to claim 1, further comprising:
- a field oxide structure provided on the semiconductor layer and located between the anode and cathode; and
- a cathode polysilicon field plate provided on the field oxide structure and electrically connected to the cathode electrode.

4. The diode according to claim 1, wherein a width of each trench type contact is 0.3% to 0.5% of a width of the cathode.

5. The diode according to claim 1, wherein the cathode electrode forms an ohmic contact with the cathode doped region through a contact, and the cathode electrode is not in direct contact with the trench type contact.

6. The diode according to claim 3, wherein the anode comprises:
- a well region having a second conductivity type and provided in the semiconductor layer;
- an anode doped region having the second conductivity type and provided in the well region, a doping concentration of the anode doped region being greater than a doping concentration of the well region; and
- an anode electrode, a part of the anode electrode being in direct contact with the anode doped region through a contact, and a part of the anode electrode being in direct contact with the well region through a contact.

7. The diode according to claim 6, wherein the well region comprises at least two anode doped regions, the anode doped regions in the well region are spaced apart from each other through the well region, each anode doped region forms an ohmic contact with a conductive material in the contact, and the well region forms a Schottky contact with the conductive material in the contact.

8. The diode according to claim 6, further comprising an anode polysilicon field plate provided on the field oxide structure and electrically connected to the anode electrode.

9. The diode according to claim 6, further comprising a plurality of isolation trench structures extending downwards to the insulating buried layer, the isolation trench structures being provided on a side of the well region away from the cathode and a side of the cathode doped region away from the anode.

10. The diode according to claim 1, wherein the diode is a fast recovery SOI high voltage freewheeling diode.

11. A semiconductor device based on a silicon on insulator structure, comprising:
- a lateral insulated gate bipolar transistor; and
- the diode according to claim 1 integrated with the lateral insulated gate bipolar transistor, the diode being connected in parallel between a collector and an emitter of the lateral insulated gate bipolar transistor.

12. A method for manufacturing a diode, the diode being based on a silicon on insulator structure, the method comprising:
- providing a base, the base comprising a substrate, an insulating buried layer, and a semiconductor layer that are sequentially stacked;
- forming a first trench extending from a first surface of the semiconductor layer to a second surface of the semiconductor layer, wherein the first surface is a surface away from the insulating buried layer, and the second surface is a surface facing the insulating buried layer;
- forming a cathode doped region on the semiconductor layer at a periphery and a bottom of the first trench, the cathode doped region having a first conductivity type;
- filling a contact material in the first trench;
- forming a first conductivity type well region between the bottom of the first trench and the insulating buried layer, the semiconductor layer comprising a drift region of the first conductivity type, a doping concentration of the first conductivity type well region being greater than a doping concentration of the drift region; and
- forming a cathode electrode on the cathode doped region and electrically connected to the cathode doped region.

13. The method according to claim 12, wherein the step of forming the first trench extending from the first surface of the semiconductor layer to the second surface of the semiconductor layer is performed through an etching process, and an isolation trench structure is simultaneously formed by etching, a width of the first trench is less than a width of the isolation trench structure, the isolation trench structure extends to the insulating buried layer, and a depth of the isolation trench structure is greater than a depth of the first trench.

14. The method according to claim 12, wherein after the step of filling the contact material in the first trench, the method further comprises:

forming a field oxide structure;

forming a well region in the semiconductor layer;

forming an anode doped region in the well region;

forming an anode polysilicon field plate and a cathode polysilicon field plate on the field oxide structure; and forming an anode electrode, the anode electrode being electrically connected to the anode polysilicon field plate, the well region, and the anode doped region.

15. The diode according to claim 6, wherein the first conductivity type is N type, and the second conductivity type is P type.

16. The diode according to claim 1, wherein both the substrate and the semiconductor layer are silicon layers, and the insulating buried layer is a buried oxide layer.

17. The method according to claim 12, wherein filling the contact material in the first trench to obtain a trench contact, a width of the first trench is 0.3% to 0.5% of a width of the cathode, the cathode comprises the trench contact, the cathode doped region, and the cathode electrode.

18. The method according to claim 12, wherein the diode is a fast recovery SOI high voltage freewheeling diode.

19. The method according to claim 14, wherein the well region has a second conductivity type, the first conductivity type is N type, and the second conductivity type is P type.

* * * * *